US005484075A

United States Patent [19]

Kimura et al.

[11] Patent Number: 5,484,075

[45] Date of Patent: Jan. 16, 1996

[54] METHOD OF MANUFACTURING INK JET RECORDING HEAD

[75] Inventors: Isao Kimura; Takashi Fujikawa, both of Kawasaki, Japan

[73] Assignee: Canon Kabushiki Kaisha, Tokyo, Japan

[21] Appl. No.: 975,411

[22] Filed: Nov. 12, 1992

[30] Foreign Application Priority Data

Nov. 12, 1991 [JP] Japan .................................... 3-295853

[51] Int. Cl.[6] ............................ B44C 1/22; H01L 21/306

[52] U.S. Cl. ..................... 216/27; 156/633.1; 156/647.1; 156/659.11; 216/33; 216/41

[58] Field of Search .................................... 156/633, 634, 156/647, 655, 656, 657, 659.1, 662, 664, 668; 346/1.1, 76 PH, 140 R; 338/308, 309; 216/16, 17, 20, 27, 33, 35, 41

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,723,129 | 2/1988 | Endo et al. | 346/1.1 |
| 4,740,796 | 4/1988 | Endo et al. | 346/1.1 |
| 4,889,587 | 12/1989 | Komuro | 156/633 X |
| 5,066,963 | 11/1991 | Kimura et al. | 346/140 R |
| 5,126,768 | 6/1992 | Nozawa et al. | 156/644 |

FOREIGN PATENT DOCUMENTS

| | | |
|---|---|---|
| 59-123670 | 7/1984 | Japan . |
| 59-138461 | 8/1984 | Japan . |
| 61-98549 | 5/1986 | Japan . |

*Primary Examiner*—William A. Powell
*Attorney, Agent, or Firm*—Fitzpatrick, Cella, Harper & Scinto

[57] ABSTRACT

The present invention discloses a recording head and a method of manufacturing the recording head including an electrothermal transducer element for causing ink to be discharged through a discharge port by causing heat energy to act on the ink, a heat acting portion for causing the heat energy generated by the electrothermal transducer element to act on the ink present in an ink passage; and a substrate, either side of which has the electrothermal transducer element, and a residual side of which has the ink passage, so that the reliability is improved, an image is precisely recorded at high speed and an excellent manufacturing yield is realized.

14 Claims, 7 Drawing Sheets

METHOD OF MANUFACTURING INK JET RECORDING HEAD

BACKGROUND OF THE INVENTION

1. Field of the Invention

The present invention relates to an ink jet recording head for discharging ink to a recording medium through an ink discharge port, a method of manufacturing the ink jet recording head, and a recording apparatus having the ink jet recording head.

2. Related Background Art

U.S. Pat. Ser. Nos. 4,723,129 and 4,740,796 have disclosed ink jet recording methods (that is, bubble jet recording methods) of a type which is capable of recording a high quality and precise image at high speed and high density and which can be easily adapted to a color recording system and to a compact size apparatus. Therefore, they have attracted attention in recent years. A typical example of an apparatus which employs the aforesaid method has a heat acting portion which cause heat to act on ink in order to discharge recording liquid (hereinafter called "ink") by utilizing heat energy.

That is, an electrothermal transducer element having a pair of electrodes and heat generating resistors, connected to the electrodes and arranged to generate heat to be supplied to the region interposed between the electrodes, is disposed to correspond to an ink passage so as to utilize heat energy generated by the heat generating resistors so as to rapidly heat the ink present on the heat acting surface to form bubbles which cause the ink to be discharged.

Since the heat acting surface of the ink jet recording head is subjected to severe conditions such as mechanical shock caused from cavitation that takes place due to repetition of generation and disappearance of the bubbles of the ink, and also subjected to erosion, and the temperature is rapidly raised and lowered in a range of about 1000° C. in an extremely short time of 0.1 to 10 microseconds, a layer for protecting the heat generating resistor from the environment, in which the ink jet recording head is used, is necessary. The protection layer must have excellent heat resisting, liquid resisting, liquid permeability preventing, acid stability, insulating, damage resisting and heat conductive characteristics and therefore an inorganic compound such as $SiO_2$ is ordinarily employed. Since a protection layer constituted by a single layer is sometimes unsatisfactory to protect the heat generating resistor, a protection layer for protecting the outermost layer which serves as the heat acting surface is sometimes made of metal such as Ta.

The protection performance of the protection layer is a critical factor for the life of the ink jet recording head. Furthermore, the heat generated by the heat generating resistor is efficiently transmitted to the heat acting surface by a so-called heat resisting layer formed below the heat generating resistor and having a low heat conductivity.

The conventional ink jet recording head structured as described above is formed in such a manner that the heat resisting layer, the electrothermal converter and the protection layer are stacked on either side of a flat and smooth supporting substrate, that is, on the surface adjacent to the heat acting surface. The aforesaid layers and the electrothermal converter are formed by any one of a vacuum evaporation method, a sputtering method, a CVD method, a spray method, a thick-film coating method, and the like. In order to obtain desired performance, a proper method is selected from the aforesaid methods.

On the other hand, the supporting substrate has a function for mechanically holding the heat resisting layer, the heat acting portion and fluid passages formed thereon and a function for quickly dispersing excessive heat conducted thereto. Therefore, the supporting substrate is typically made of single crystal Si or alumina glades. The aforesaid heat resisting layer is ordinarily formed by oxidizing the surface of the supporting substrate with heat.

However, it is very difficult for a conventional ink jet recording head of the type structured as described above to prevent a defect taken place at the time of forming the thin films because it is formed by stacking a plurality of the thin films on the supporting substrate. In particular, a defect of the protection layer critically deteriorates the life of the recording head. If the protection layer is thickened in order to prevent the defect, the heat conductivity deteriorates, causing the electric power consumption to be enlarged and heat to be stored undesirably. Hence, bubbles cannot be formed stably. What is worse, the enlargement of the electric power consumption will cause the temperature of the recording head to be changed excessively at the time of the operation of the recording apparatus. The temperature change will undesirably change the density of the recorded image by a degree corresponding to the change of the temperature. In addition, the unstable bubble formating causes the volume of the ink droplet to be changed, and also causes the density of the recorded image to be changed.

The aforesaid problem, that is, a change in the density of the obtained image, does not meet the requirement to improve the quality of the recorded image, and therefore the problem must be overcome as soon as possible. The heat generated by the heat generating resistor is transmitted toward the heat acting surface, that is, in the vertical direction and in the horizontal direction. The horizontal directional transmission of the heat raises the temperature of the recording head, causing the density of the recorded image to be undesirably changed. What is worse, the aforesaid method of forming the heat acting portion by stacking a plurality of the layers inevitably generates a stepped portion in the protection film. Since the quality of the film of the stepped portion is inferior to that of the flat portion, another problem arises in that a defect will be generated in the stepped portion.

In the conventional structure in which the electrode layer is formed on the heat generating resistor, the electrode layer is desired to be thickened in order to prevent the loss of the electricity taken place in the electrode. However, a limitation is present in thickening the electrode layer because forming of the aforesaid step in the protection layer must be prevented. Furthermore, the electrode pattern cannot be widened sufficiently because there has recently been an increased desire to record an image at high density. As described above, the high density recording encounters the noted design limitation and a limitation in terms of ease of manufacturing.

That is, the number and the size of foreign matter particles (points where the defects originate) generated at the time of the pattern forming process and the handling process during the process of forming the films are relatively enlarged in inverse proportion to the size of the formed pattern although each of the number of the foreign matter particles and the size has a predetermined distribution. Therefore, the subject facility must be further cleaned up in order to remove the foreign matters. Furthermore, the cleanliness must be maintained also during the manufacturing process. If a satisfactory cleanliness cannot be realized, the manufacturing yield will deteriorate. Therefore, the cost to maintain the cleanliness will raise the overall cost of the recording head.

SUMMARY OF THE INVENTION

Accordingly, an object of the present invention is to provide an ink jet recording head, a method of manufacturing the recording head and an ink jet recording apparatus having the recording head which is reliable, which is capable of precisely recording an image at high speed and which can be manufactured at an excellent yield.

Another object of the present invention is provide a recording head and a method of manufacturing the recording head which does not necessitate the protection film to be thickened to prevent problems that arise when stacking a plurality of thin films on the substrate.

Another object of the present invention is to provide a recording head and a method of manufacturing the recording head including a protection film having an optimum thickness so that an increase of power consumption is prevented and unstable foaming that takes place due to heat storage in the protection film is prevented.

Another object of the present invention is to provide a recording head and a method of manufacturing the recording head which can be freed from a limitation present in forming a stepped portion in a protection layer formed by stacking a plurality of layers and in which an electricity loss in the electrode can be restricted.

Another object of the present invention is to provide a recording head and a method of manufacturing the recording head comprising an electrothermal transducer element for causing ink to be discharged through a discharge port by causing heat energy to act on the ink, a heat acting portion for causing the heat energy generated by the electrothermal converter to act on the ink present in an ink passage; and a substrate, either side of which has the electrothermal converter, and a residual side of which has the ink passage.

Other and further objects, features and advantages of the invention will be appear more fully from the following description.

DETAILED DESCRIPTION OF PREFERRED EMBODIMENTS

Preferred embodiments of the present invention will now be described with reference to the drawings.

The inventors of the present invention paid attention to the heat conductivity of the supporting substrate in order to constitute a recording head capable of overcoming the aforesaid problems. In order to examine whether or not the aforesaid recording head can be constituted, a one-dimensional heat conductivity simulation was performed while using an imaginary heat conductive property as a model. The properties of the supporting substrate, the structure of the recording head and the driving conditions are as follows, and typical simulation data is as shown in FIG. 1.

| | |
|---|---|
| (Physical Properties of Supporting Substrate | |
| Heat Conductivity: λ [W/m · K] | 100 |
| Specific Heat: Cp [J/kg · K] | 500 |
| Density: ρ [g/cm$^3$] | 2.0 |
| (Composition of Layers) | |
| Composition of layers in the cross sectional direction (called Layer 1, Layer 2, . . ., when viewed from the layer adjacent to the ink) | |
| Layer 1: Ta | 0.5 μm |
| Layer 2: Supporting substrate | 5.0 μm |
| Layer 3: $HfB_2$ | 0.1 μm (heat generating member) Area resistance 13 Ω/square |
| Layer 4: $SiO_2$ | 2.8 μm |
| (Driving Conditions) | |
| Driving Voltage: | 18 V DC (voltage at which foaming is started: 15 V) |
| Width of Driving Pulse: | 7.0 μsec |
| Properties of Ink: | λ = 0.5, Cp = 4000, ρ = 1.0 |
| Temperature at which ink starts foaming: | 305° C. |

Figure 1:
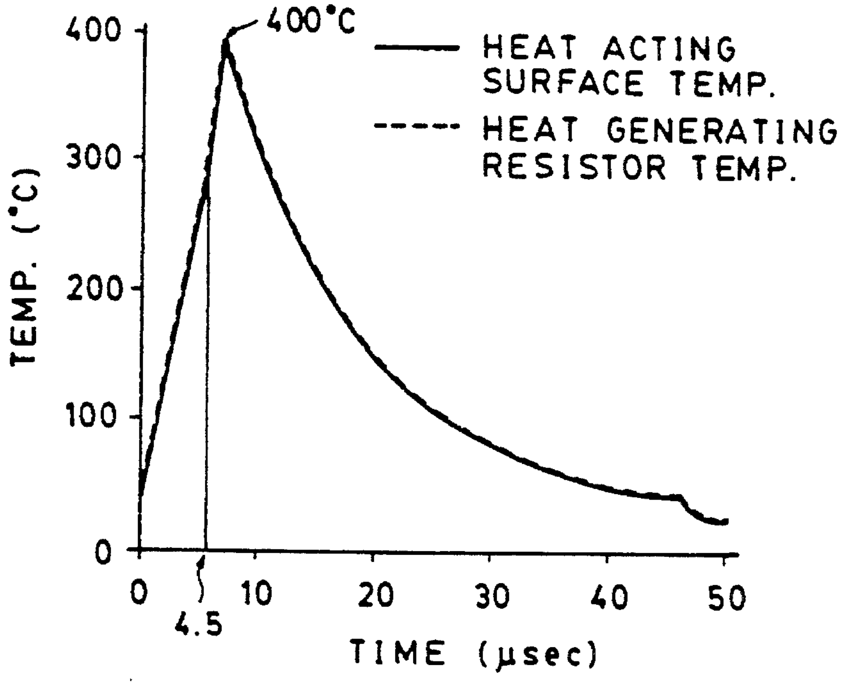
FIG. 1 illustrates a one-dimensional heat conductivity simulation on which the present invention is based.

It was found from the results shown in FIG. 1 that bubbles were generated 4.5 μsec after the pulses had been applied, and the highest temperature, to which the heat generating resistor was heated, was 400° C. Therefore, it was confirmed that the structure according to the present invention could be realized. In order to make a comparison, one of the conventional ink jet recording heads structured as follows was subjected to the one-dimensional heat conductive simulation. It should be noted that the properties of the supporting substrate and those of the ink were the same as the aforesaid example.

| | |
|---|---|
| Composition of layers in the cross sectional direction (called Layer 1, Layer 2, . . ., when viewed from the layer adjacent to the ink) | |
| Layer 1: Ta | 0.5 μm |
| Layer 2: $SiO_2$ | 2.0 μm |
| Layer 3: $HfB_2$ | 0.1 μm (heat generating member) |
| Layer 4: $SiO_2$ | 2.8 μm |
| Layer 5: Supporting substrate | 525 μm |
| (Driving Conditions) | |

-continued

| | |
|---|---|
| Driving Voltage: | 24 V DC (voltage at which foaming is started: 20 V) |
| Width of Driving Pulse: | 7.0 μsec |

Figure 2:
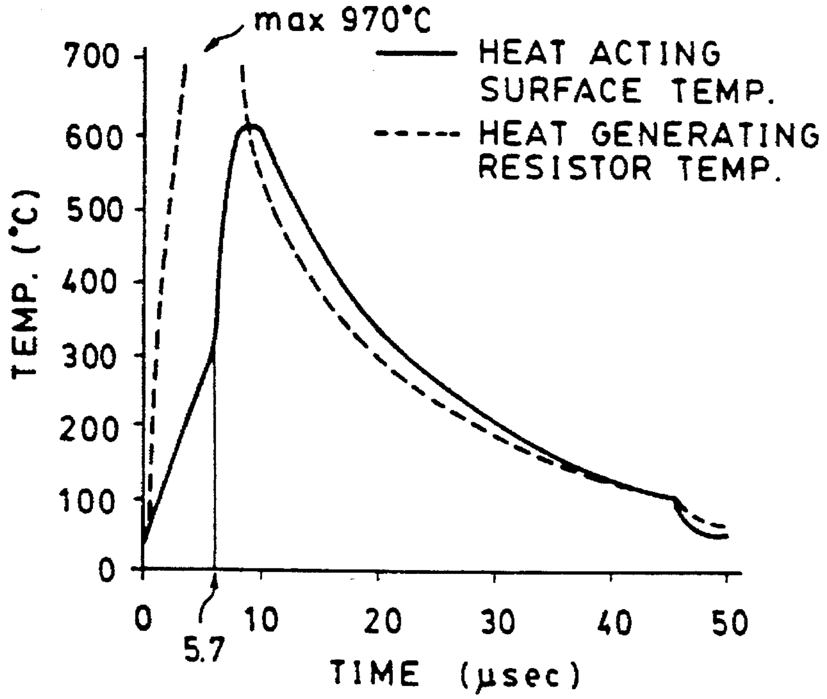
FIG. 2 PRIOR ART
FIG. 2 illustrates a one-dimensional heat conductivity simulation of a conventional ink jet recording head.

The results are shown in FIG. 2. As shown in FIG. 2, bubbles were generated 5.7 μsec after the pulses had been applied and the highest temperature, to which the heat generating resistor was heated, was 970° C. Therefore, the heat generating resistor was heated to a temperature higher than the temperature to which the heat generating resistor according to the present invention is heated. Hence, it can be expected that the conditions, under which the heat generating resistor according to the comparative example is used, become more severe.

The heat efficiency {=(the heating value transmitted to the ink)/(electric power supplied to the heat generating resistor)} of the recording head according to the present invention is 25% and that of the conventional recording head is 11%. Therefore, the structure according to the present invention is superior to the conventional structure in terms of the heat efficiency. Since the fact that the structure according to the present invention can be established was confirmed from the result of the aforesaid consideration, the conditions of the supporting substrate, which is capable of realizing the aforesaid structure, were examined, resulting the following knowledge to be obtained.

First, the heat conductivity must be about 100 W/m.k, preferably a value smaller than this in order to improve the heat efficiency. Furthermore, the heat resistance must be a level higher than the temperature to which the heat generating resistor is heated. More specifically, the melting point or the decomposition temperature of the employed material must be higher than 500° C. In the case where the structure in which the supporting substrate is positioned in contact with the ink in a direct manner is employed, the material cannot easily be reacted with the employed ink.

Furthermore, the supporting substrate must have sufficient mechanical strength to hold the functional portions to be formed on the corresponding side thereof. However, the aforesaid fact is not required in the case where the structure (the ink passage or the like) on the supporting substrate have the sufficient strength. The materials which meet the aforesaid conditions are exemplified by Al, Si, metal of group IVa of the periodic table such as Ti, Zr and Hf, metal of group Va of the periodic table such as V, Nb and Ta, metal of group VIa of the periodic table such as Cr, Mo and W, metal of group VIII of the periodic table such as Fe, Co and Ni, and their alloys. Furthermore, alumina or a ceramic having excellent heat conductivity, that is, AlN, BN, TiN, SiN or SiC may be employed.

In order to restrict the horizontal directional transmission of the heat generated by the heat generating resistor, a layer having a low heat conductivity must be formed between the heat generating resistor columns. The materials which meet the aforesaid requirement are exemplified by a metal oxide such as $SiO_2$ or $ZrO_2$, or glass, and preferably, an organic polymer such as a polyimide and polysiloxane having a heat conductivity of about 0.1 W/m.K.

Figure 3:
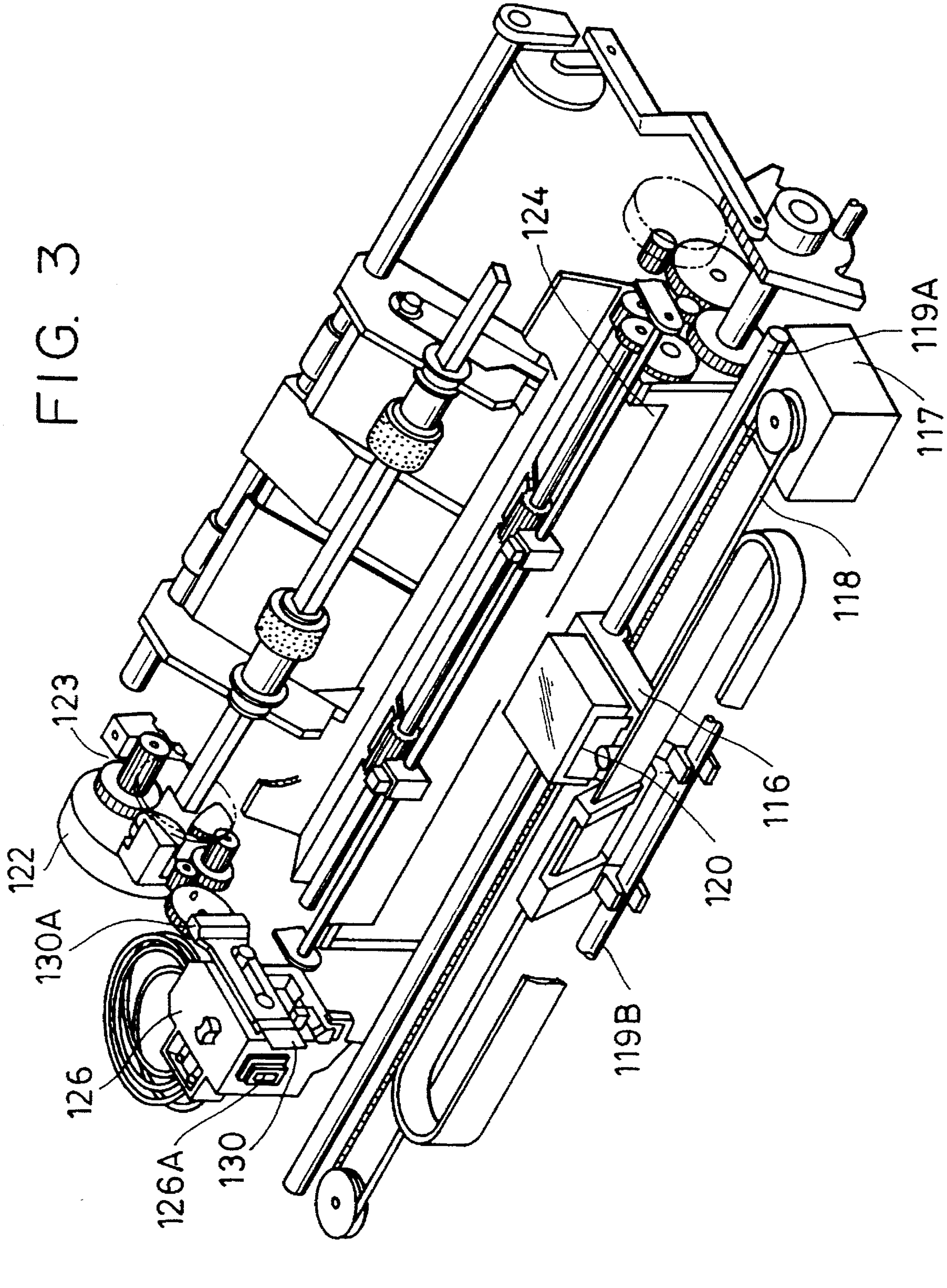
FIG. 3 is a perspective view which illustrates an example of a recording apparatus having an ink jet recording head according to an embodiment of the present invention.

FIG. 3 is a schematic perspective view which illustrates an example of an ink jet recording apparatus (IJRA) constituted by mounting an ink jet head cartridge (IJC) which includes the recording head according to the present invention.

Referring to FIG. 3, reference numeral 120 represents an ink jet head cartridge (IJC) having a nozzle group for discharging ink to the recording surface of recording paper moved onto a platen 124. Reference numeral 116 represents a carriage HC for holding the IJC 120, the carriage HC being connected to a portion of a drive belt 118 for transmitting the rotational force of a driving motor 117 in such a manner that it is able to slide on two guide shafts 119A and 119B running in parallel to each other. As a result, the ink jet head carriage IJC 120 is able to reciprocate over the width of the recording paper.

Reference numeral 126 represents a head restoring device disposed at a position to face an end portion of a passage, through which the IJC 120 is moved, for example, to face the home position. The motor 122 operates the head restoring device 16 via a transmission mechanism 123 so that capping of the IJC 120 is performed. In synchronization with the operation of capping the IJC 120 by means of a cap portion 126A of the head restoring device 126, the ink is sucked by an arbitrary suction means disposed in the head restoring device 126, or the same is, with pressure, sent by an arbitrary pressurizing means disposed in an ink supply passage so that ink is forcibly discharged through a discharge port. As a result, a discharge restoring operation for removing the ink having a high viscosity and present in the nozzle for example is performed. Furthermore, the capping is performed at the time of the completion of the recording operation so that the IJC 120 is protected.

Reference numeral 130 represents a blade disposed on the side surface of the head restoring device 126 and serving as a wiping member made of silicon rubber. The blade 130 is held by a blade holding member 130A in a cantilever manner, and is operated by the motor 122 and the transmission mechanism 123 similarly to the head restoring device 126 so that the blade 130 can be brought into contact with the discharging surface of the IJC 120. As a result, the blade 130 can be allowed to project into the passage, through which the IJC 120 is moved, at a proper timing during the recording operation performed by the IJC 120 or after the discharge restoring process has been performed by using the head restoring device 126. Hence, condensed dew, a wet portion or dust present on the discharging surface of the IJC 120 can be wiped out in synchronization with the movement of the IJC 120.

The present invention will now be described in detail with reference to examples. However, the present invention is not limited to the description of those examples made hereinafter.

EXAMPLE 1

Figure 4:
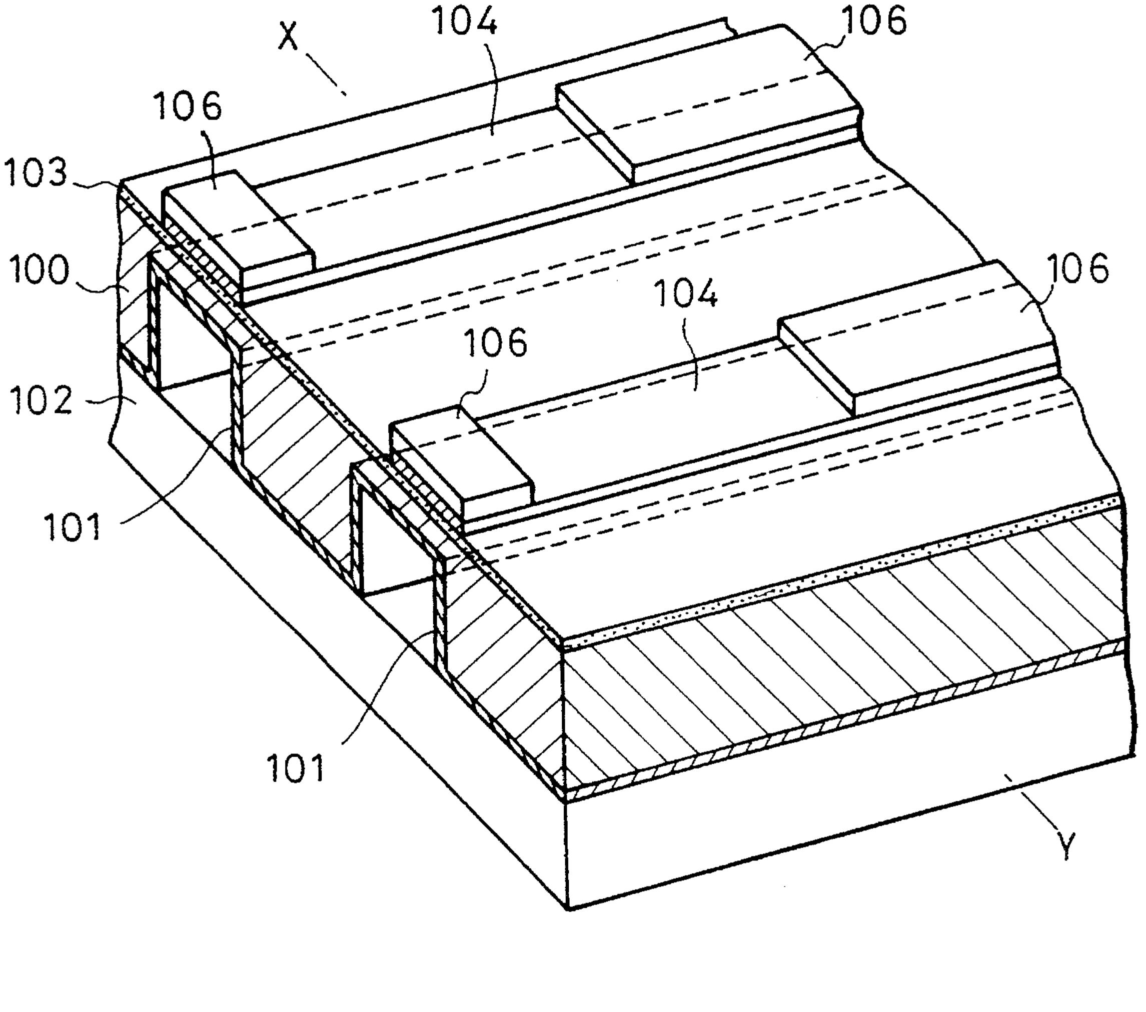
FIG. 4 is a perspective view which illustrates the schematic structure of an ink jet recording head according to an embodiment of the present invention.
Figure 5:
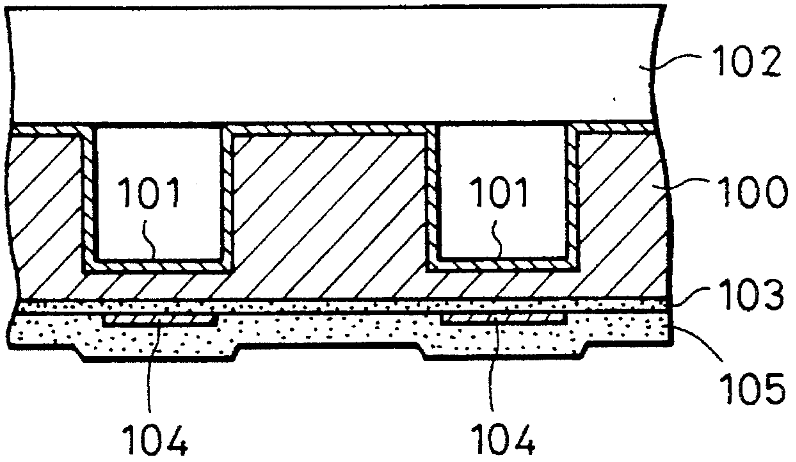
FIG. 5 is a cross sectional structural view taken along plane X-Y of FIG. 4.

FIG. 4 is a perspective view which schematically illustrates the ink jet recording head according to the present invention. FIG. 5 is a cross sectional structural view taken along line X-Y of FIG. 4. In order to easily make the description, a protection layer 105 for protecting a heat generating resistor 104 and an electrode line 106 is omitted.

An Au film having a thickness of 0.5 μm was, by the vacuum evaporation, formed on the surface of a Si (100) single crystal substrate (which is a p-type substrate having a diameter of 4 inches and a thickness of 100 μm). Then, a resist was applied on the Au film, and the resist of a predetermined pattern of a desired fluid passage was patterned by photolithography. Then, the Au film thus-formed was etched by aqua regia (3 parts (by weight) of 99% hydrochloric acid +1 part (by weight) of 99% nitric acid) so that an Au fluid passage pattern was formed. The resist layer on the Au film was removed, and the Si substrate was etched with a 40% KOH water solution, the temperature of which was 60° C., so that a fluid passage wall 100 (30 μm high) shown in FIGS. 4 and 5 was formed. Then, the Au film was dissolved and removed by the aforesaid aqua regia.

Then, the substrate was placed in a heat-processing furnace so as to be oxidized at 1200° C. for 6 minutes. As a result, a Si oxidized film (omitted from illustration) which was 0.1 μm thick was formed on each of the surfaces (both sides) of the substrate. Then, the substrate was placed at a predetermined position in an RF magnetron sputtering apparatus in such a manner that the surface of the substrate, in which the fluid passage was formed, could be subjected to sputtering in which a Ta target (purity: 99.9%) having a diameter of 5 inches and a thickness of 5 mm was sputtered for 30 minutes with a supplied electric power of 1.0 kw and an Ar gas the pressure of which was $3\times 10^{-3}$ torr. As a result, the outermost protection layer (101 of FIGS. 4 and 5) having a thickness of 0.5 μm and corresponding to the heat acting surface was formed.

Then, a glass plate which was 1 mm thick and which was arranged to cover the fluid passage formed in the substrate was joined by using an epoxy resin so that an ink passage was formed in the surface of the substrate. In this state, the surface of the substrate opposing the ink passage was mechanically ground so as to reduce the thickness of the substrate 100 to 32 μm. Then, the substrate was placed at a predetermined position in the RF magnetron sputtering apparatus (CFS-8E manufactured by Tokuda Seisakusho) in such a manner that the surface of the substrate opposing the ink passage could be subjected to sputtering in which a $SiO_2$ target (purity: 99%) having a diameter of 5 inches and a thickness of 5 mm was sputtered for 4 minutes with a supplied electricity of 0.5 kw and an Ar gas the pressure of which was $5\times10^{-3}$ torr. As a result, an electricity insulting layer 103 shown in FIGS. 4 and 5 and having a thickness of 0.1 μm was formed.

Then, the substrate was placed in a predetermined position of the aforesaid RF magnetton sputtering apparatus so that sputtering was performed for 30 minutes with a supplied electricity of 0.5 kW and an Ar gas the pressure of which was $4\times10^{-3}$ torr by using a $HfB_2$ target (purity: 99%) having a diameter of 5 inches and a thickness of 5 mm. As a result, a heat generating resistor film 104 (which was 0.1 μm thick and shown in FIGS. 4 and 5) was formed. The specific resistance of the formed heat generating resistor was measured by a known method, resulting in 230 μΩ.cm. Then, an Al film having a thickness of 0.5 μm was formed on the heat generating resistor film by electron beam evaporation, and a photolithographic process is performed so that the electrode circuit 106 shown in FIG. 4 was formed.

Then, the pattern of a heat generating resistor 104 shown in FIGS. 4 and 5 was formed by the photolithographic process, and an Si02 target (purity: 99%) having a diameter of 5 inches and a thickness of 5 mm was sputtered for 40 minutes by the RF magnetton sputtering apparatus with a supplied electricity of 0.5 kW under a pressure of $5\times10^{-3}$ torr so that a $SiO_2$ film having a thickness of 1.0 μm was formed and the protection film 105 shown in FIG. 5 was formed.

Figure 6:
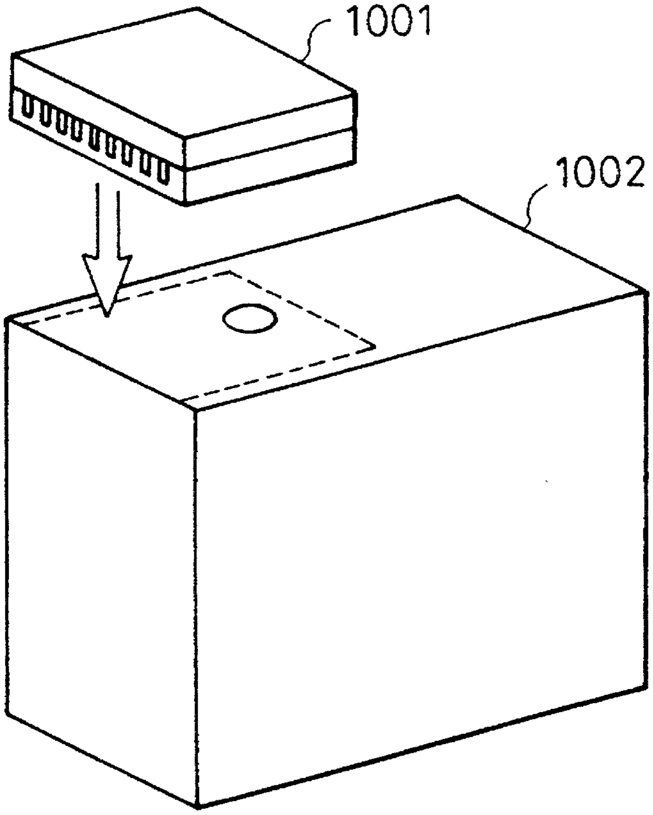
FIG. 6 is a schematic view which illustrates a state in which a discharge element and an ink tank are joined up.

Each electrode circuit has a terminal (omitted from illustration) which receives a signal supplied from outside. As a result of the aforesaid process, one element of heat acting portion, which is positioned in contact with the fluid, was constituted by 24 heat generating portions the size of each of which was 30 μm×150 μm and which were disposed at a pitch of 125 μm. Then, the 4-inch substrate was cut into discharge elements 1001 (see FIG. 6) each having a size of 10 mm×10 mm. One of the elements 1001 was bonded to an ink tank 1002 shown in FIG. 6 by a silicon resin so that the ink jet recording head was manufactured.

Then, the discharging performance and printing performance of the ink jet recording head according to Example 1 were subjected to tests. Five elements were randomly selected from the elements obtained by cutting one substrate so as to be respectively tested with the same driving pulses. It should be noted that the driving voltage shown in Table 1 was the voltage the level of which was 1.2 times the voltage with which bubbles could be formed.

The discharging performance was evaluated in such a manner that rectangular electric current pulses of a predetermined voltage were applied, the frequency of the pulse was gradually raised from 50 Hz, and the frequency (fmax), realized in a state where the generated bubble cannot disappear in accordance with the period of the pulse and the ink cannot therefore be discharged (this state will be hereinafter called a "non-discharge state"), was used to make an evaluation. The aforesaid method is an experiment for evaluating the heat radiating performance of the ink jet recording head, and in which the high speed recording performance is in proportion to the frequency fmax at which the non-discharge state is realized.

The printing performance was evaluated by a process in which an A4-size document pattern was repeatedly printed by using the subject recording head and the number (Pmax) of the printed sheets was evaluated at which the printed characters became blurred or the dot of the character became wanting. The aforesaid method is able to evaluate the durability of the recording head, the durability being in proportion to Pmax. The results of the aforesaid evaluations are shown in Table 1. It was understood from table 1 that fmax and Pmax of the ink jet recording head according to example 1 were 1.19 times and 2.50 times those of the conventional ink jet recording head (Comparative Example 1). The reason why Pmax was improved lies in that the scattering of the five heads can be considerably reduced and the fluid passage has no defective portion.

Although the material which constitutes the fluid passage is the same as that which constitutes the supporting substrate, the same effect as that obtainable from Example 1 can be obtained if the fluid passage is, similar to Comparative Example 1, made of a material such as a polyimide resin which is different from the material which constitutes the supporting substrate.

Comparative Example 1

Figure 7:
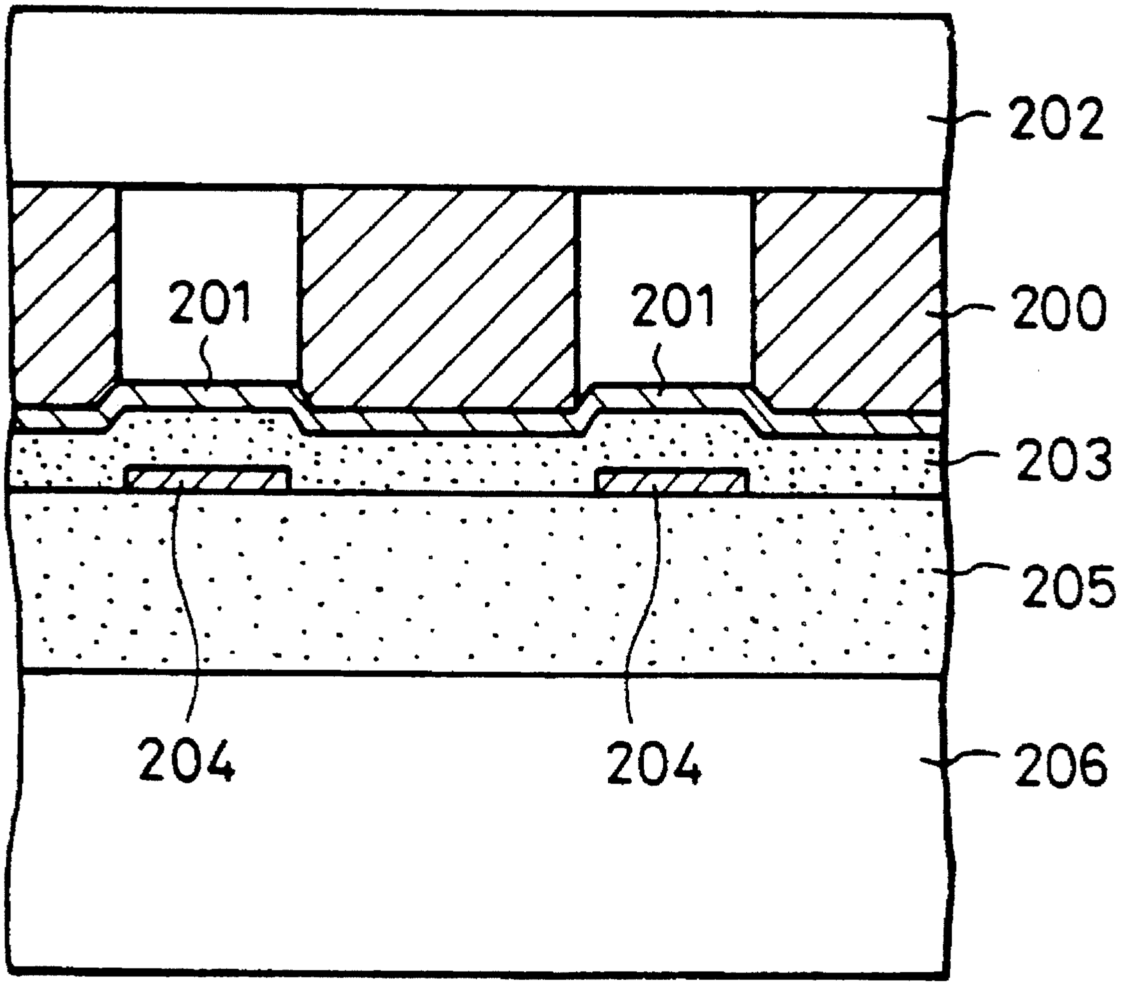
FIG. 7 PRIOR ART
FIG. 7 is a partial cross sectional structural view which illustrates one of the conventional ink jet recording heads.

FIG. 7 is a partial cross sectional view which illustrates a conventional ink jet recording head according to a comparative example. A single crystal Si (111) substrate (which was a p-type substrate having a diameter of 4 inches and a thickness of 525 μm) 206 shown in FIG. 7 and having a heat oxidized $SiO_2$ layer 205 shown in FIG. 7 and having a thickness of 2.75 μm on the surface thereof was placed at a predetermined position in the RF magnetton sputtering apparatus so as to be sputtered for 30 minutes with a supplied electricity of 0.5 kW and an Ar gas the pressure of which was $4\times10^{-3}$ torr by using a $HfB_2$ target similar to Example 1 so that a heat generating resistor 204 was formed.

Then, an Al film having a thickness of 0.5 μm was stacked on the heat generating resistor by the electron beam evaporation, and a photolithographic process was performed so that an electrode circuit (omitted from illustration) was formed. Then, the photolithographic patterning process was performed so that the width of the electric line was made to be 30 μm wide. Then, a portion corresponding to the heat generating portion (30 μm×150 μm) of the electrode line was removed so that the pattern of a heat generating resistor 204 shown in FIG. 7 was formed.

Then, the RF magnetron sputtering apparatus similar to Example 1 was used to stack an SiO2 layer for covering the heat generating resistor and having a thickness of 2.0 μm so that an electricity insulating layer 203 shown in FIG. 7 was formed. Then, the RF magnetron sputter apparatus was used to form a Ta film 201 (see FIG. 7) serving as the protection layer for protecting the outermost surface corresponding to the heat acting surface to have a thickness of 0.5 μm under the same conditions as those according to Example 1. It should be noted that a terminal (omitted from illustration) for receiving a signal supplied from outside is provided for each of the electrode circuits.

As a result of the aforesaid process, one element a heat acting portion, which is positioned in contact with the fluid, was constituted by 24 heat generating portions the size of each of which was 30 μm×150 μm and which were disposed at a pitch of 125 μm. Then, an insulating wall 200 shown in FIG. 7, 30 μm high and made of a polyimide resin was formed by a known method so as to make the fluid passage, connected to a discharge port, and positioned to correspond to each heat generating portion. Furthermore, a flat glass plate 202 (see FIG. 7) for covering the aforesaid insulating wall was bonded by an epoxy resin. Then, the 4-inch substrate was cut into discharge elements each having a size of 10 mm×10 mm so that the ink jet recording head was manufactured. The structure and the dimensions of the fluid passage were made to be the same as those of the fluid passage of the ink jet recording head according to Example 1.

Then, the discharging performance and printing performance were subjected to tests similarly to Example 1, resulting in data as shown in Table 1. As can be seen from Table 1, the average fmax was 5.00 kHz and the average Pmax was 3500 sheets. A large degree of scattering takes place between 5 heads in comparison to Example 1. It can be considered that the reason for this lies in that presence of a stepped portion in the protection film on the side with which the fluid comes in contact causes a defect to be generated and the life is therefore shortened or the electric line can be disconnected in a relatively short time because of a defect starting from the defect of the protection film on the heat acting surface.

Example 2

Figure 8:
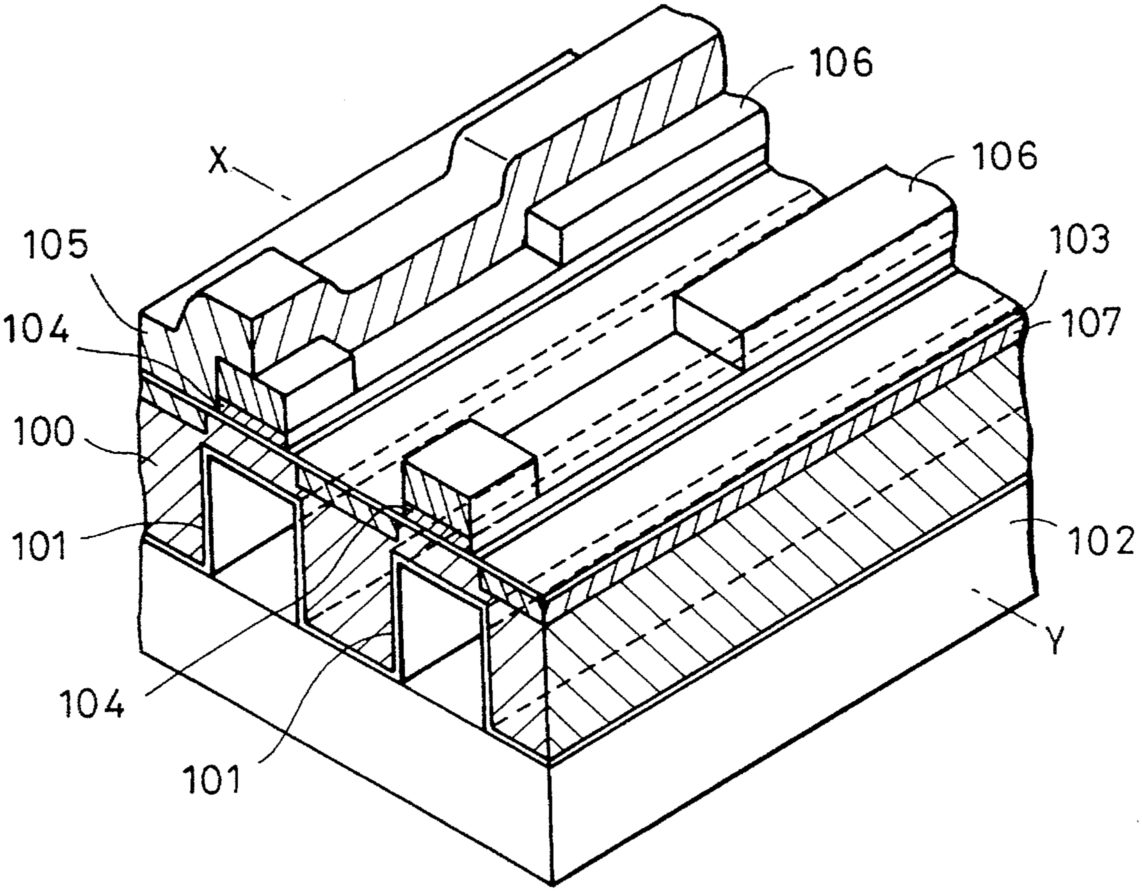
FIG. 8 is a perspective view which illustrates the schematic structure of an ink jet recording head according to another embodiment of the present invention.
Figure 9:
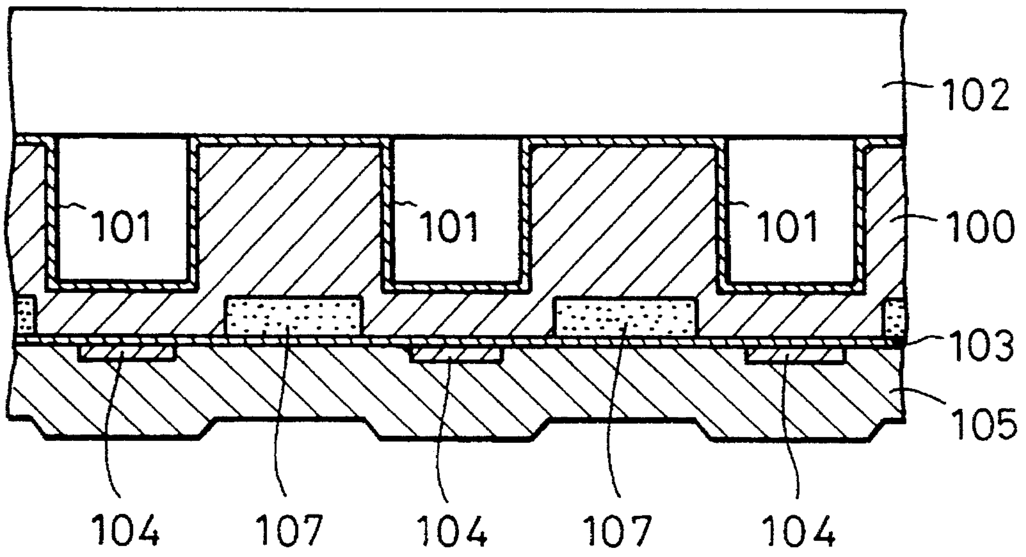
FIG. 9 is a cross sectional structural view taken along plane X-Y of FIG. 8.

FIG. 8 is a perspective view which schematically illustrates the ink jet recording head according to the present invention. FIG. 9 is a cross sectional structural view taken along line X-Y of FIG. 8.

An Au film having a thickness of 0.5 μm was, by the vacuum evaporation, formed on the surface of a Si (100) single crystal substrate (which is a p-type substrate having a diameter of 4 inches and a thickness of 100 μm). Then, a resist was applied on the Au film, and the resist of a predetermined pattern of a desired fluid passage was patterned by photolithography. Then, the Au film thus-formed was etched by aqua regia (3 parts (by weight) of 99% hydrochloric acid+1 part (by weight) of 99% nitric acid) so that an Au fluid passage pattern was formed. The resist layer on the Au film was removed, and the Si substrate was etched with a 40% KOH water solution, the temperature of which was 60° C., so that a fluid passage wall (30 μm high) shown in FIGS. 8 and 9 was formed. Then, the Au film was dissolved and removed by the aforesaid aqua regia.

Then, the substrate was placed in a heat-processing furnace so as to be oxidized at 1200° C. for 6 minutes. As a result, a Si oxidized film (omitted from illustration) which was 0.1 μm thick was formed on each of the surfaces (both sides) of the substrate. Then, a resist was applied to the substrate while making its surface, which opposes the surface in which the fluid passage was formed, to appear, and a resist pattern was formed in a portion corresponding to the heat generating resistor column by a photolithographic process. The substrate was then placed at a predetermined position in an RF magnetron sputtering apparatus (CFS-8EP manufactured by Tokuda Seisakusho) so as to etch the surface of the substrate by sputtering with a supplied electric power of 1.0 kw and an Ar gas the pressure of which was $3\times10^{-3}$ torr. As a result, a groove which was 3 μm deep was formed. Then, the substrate was ejected from the aforesaid apparatus, and the resist pattern was dissolved and removed.

Then, a photosensitive polyimide resin (trade name: Photoniese UR-3100 manufactured by Toray) was formed to the surface of the substrate which opposes the surface in which the fluid passage was formed, and it was dried at 80° C. Then, a photolithographic process was preformed so as to form a layer with which the groove, which was 3 μm deep, was filled, that is, a heat resisting layer 107 shown in FIG. 9 between the heat generating resistor columns. Furthermore, the substrate was cured at 300° C. for 1 hour.

Then, the substrate was placed at a predetermined position in the RF magnetton sputtering apparatus in such a manner that the surface of the substrate in which the fluid passage was formed could be subjected to sputtering in which a Ta target (purity: 99.9%) having a diameter of 5 inches and a thickness of 5 mm was sputtered for 30 minutes with a supplied electricity of 1.0 kw and an Ar gas the pressure of which was $3\times10^{-3}$ torr. As a result, a protection layer 101 shown in FIGS. 8 and 9 for protecting the outermost surface, which corresponds to the heat acting surface, was formed. Then, a glass plate 102 shown in FIGS. 8 and 9 which was 1 mm thick and which was arranged to cover the fluid passage formed in the substrate was joined by using an epoxy resin so that an ink passage was formed in the surface of the substrate. In this state, the surface of the substrate opposing the ink passage was mechanically ground so as to reduce the thickness of the substrate to 35 μm.

Then, the substrate was placed at a predetermined position in the RF magnetton sputtering apparatus in such a manner that the surface of the substrate opposing the ink passage could be subjected to sputtering in which a $SiO_2$ target (purity: 99%) having a diameter of 5 inches and a thickness of 5 mm was sputtered for 4 minutes with a supplied electricity of 0.5 kW and an Ar gas the pressure of which was $5\times10^{-3}$ torr. As a result, an electricity insulting layer 103 shown in FIGS. 8 and 9 and having a thickness of 0.1 μm was formed. Then, the substrate was placed in a predetermined position of the aforesaid RF magnetron sputtering apparatus so that sputtering was performed for 30 minutes with a supplied electricity of 0.5 kW and an Ar gas the pressure of which was $4\times10^{-3}$ torr by using a $HfB_2$ target (purity: 99%) having a diameter of 5 inches and a thickness of 5 mm. As a result, a heat generating resistor film 104 (which was 0.1 μm thick and shown in FIGS. 4 and 5) was formed. The specific resistance of the formed heat generating resistor was measured by a known method, resulting in 235 μΩ.cm.

Then, an Al film having a thickness of 0.5 μm was formed on the heat generating resistor film by electron beam evaporation, and a photolithographic process was performed so that the electrode circuit 106 shown in FIG. 8 was formed. Then, the pattern of a heat generating resistor 104 shown in FIG. 9 was formed by the photolithographic process. Then, an $SiO_2$ target (purity: 99%) having a diameter of 5 inches and a thickness of 5 mm was sputtered for 40 minutes by the RF magnetron sputtering apparatus with a supplied electricity of 0.5 kW and an Ar gas the pressure of which was $5\times10^{-3}$ torr so that a $SiO_2$ film having a thickness of 1.0 μm was formed and the protection film 105 shown in FIGS. 8 and 9 was formed. Each electrode circuit has a terminal (omitted from illustration) which receives a signal supplied from outside. As a result of the aforesaid process, one element of the heat acting portion, which is positioned in contact with the fluid, was constituted by 24 heat generating portions the size of each of which was 30 μm×150 μm and which were disposed at a pitch of 125 μm.

Then, the 4-inch substrate was cut into discharge elements 1001 (see FIG. 6) each having a size of 10 mm×10 mm. One of the elements 1001 was bonded to the ink tank 1002 shown in FIG. 6 by a silicon resin so that the ink jet recording head was manufactured. Then, the discharging performance and printing performance of the ink jet recording head according to Example 2 were tested. Five elements were randomly selected from the elements obtained by cutting one substrate so as to be respectively tested with the same driving pulses. It should be noted that the driving voltage shown in Table 1 was the voltage the level of which was 1.2 times the voltage with which bubble forming was started.

The discharging performance was evaluated in such a manner that rectangular electric current pulses of a predetermined voltage were applied, the frequency of the pulse was gradually raised from 50 Hz, and the frequency (fmax), realized in a state where the generated bubble cannot disappear in accordance with the period of the pulse and the ink cannot therefore be discharged (this state will be hereinafter called a "non-discharge state"), was used to make an evaluation. The aforesaid method is an experiment for evaluating the heat radiating performance of the ink jet recording head, and in which the high speed recording performance is in proportion to the frequency fmax at which the non-discharge state is realized.

The printing performance was evaluated by a process in which an A4-size document pattern was repeatedly printed by using the subject head and the number (Pmax) of the printed sheets was evaluated at which the printed characters became blurred or the dot of the character became wanting. The aforesaid method is able to evaluate the durability of the recording head, the durability being in proportion to Pmax. The results of the aforesaid evaluations are shown in Table 2. It was understood from table 2 that fmax and Pmax of the ink jet recording head according to example 2 were 1.22 times and 2.82 times those of the conventional ink jet recording head (Comparative Example 2). The reason why Pmax was improved lies in that the scattering of the five heads can be considerably reduced and the fluid passage has no defective portion.

Although the material which constitutes the fluid passage according to Example 2 is the same as that which constitute the supporting substrate, the same effect as that obtainable from Example 2 can be obtained if the fluid passage is, similarly to Comparative Example 2, made of a material such as a polyimide resin which is different from the material which constitutes the supporting substrate.

Comparative Example 2

FIG. 7 is a partial cross sectional view which illustrates a conventional ink jet recording head according to a comparative example. A single crystal Si (111) substrate (which was a p-type substrate having a diameter of 4 inches and a thickness of 525 μm) 206 and having a heat oxidized $SiO_2$ layer 205 and having a thickness of 1.90 μm on the surface thereof was placed at a predetermined position in the RF magnetron sputtering apparatus so as to be sputtered for 10 minutes with a supplied electricity of 0.5 kW and an Ar gas the pressure of which was $4\times10^{-3}$ torr by using a $HfB_2$ target similar to Example 2 so that a heat generating resistor was formed. Then, an Al film having a thickness of 0.5 μm was stacked on the heat generating resistor by the electron beam evaporation, and a photolithographic process was performed so that an electrode circuit (omitted from illustration) was formed. Then, the photolithographic patterning process was performed so that the width of the electric line was made to be 30 μm wide. Then, a portion corresponding to the heat generating portion (30 μm×100 μm) of the electrode line was removed so that the pattern of a heat generating resistor 204 shown in FIG. 7 was formed.

Then, the RF magnetron sputtering apparatus similar to Example 2 was used to stack an $SiO_2$ layer for covering the heat generating resistor and having a thickness of 1.9 μm so that an electricity insulating layer 203 shown in FIG. 7 was formed. Then, the RF magnetron sputter apparatus was used to form a Ta film 201 (see FIG. 7) serving as the protection layer for protecting the outermost surface corresponding to the heat acting surface to have a thickness of 0.5 μm under the same conditions as those according to Example 2. It should be noted that a terminal (omitted from illustration) for receiving a signal supplied from outside is provided for each electrode circuit. As a result of the aforesaid process, one element of heat acting portion, which is positioned in contact with the fluid, was constituted by 48 heat generating portions the size of each of which was 20×100 μm and which were disposed at a pitch of 62.5 μm.

Then, an insulating wall 200 shown in FIG. 7, 30 μm high and made of a polyimide resin was formed by a known method so as to make the fluid passage, connected to a discharge port, positioned to correspond to each heat generating portion. Furthermore, a flat glass plate 202 (see FIG. 7) for covering the aforesaid insulating wall was bonded by an epoxy resin. Then, the 4-inch substrate was cut into discharge elements each having a size of 10 mm× 10 mm so that the ink jet recording head was manufactured. The structure and the dimensions of the fluid passage were made to be the same as those of the fluid passage of the ink jet recording head according to Example 2.

Then, the discharging performance and printing performance were subjected to tests similarly to Example 2, resulting in data as shown in Table 2. As can be seen from Table 2, the average fmax is 5.00 kHz and the average Pmax is 3500 sheets. A large degree of scattering takes place between 5 heads in comparison to Example 1. It can be considered that the reason for this lies in that presence of a stepped portion in the protection film on the side with which the fluid comes in contact causes the a defect to be generated and the life is therefore shortened or the electric line can be disconnected in a relatively short time because of a defect starting from the defect of the protection film on the heat acting surface.

TABLE 1

| | Element No. | Voltage (V) | Driving Pulse width (μsec) | f max (kHz) | p max (sheets) |
|---|---|---|---|---|---|
| Example 1 | 1 | 18.0 | 7 | 5.95 | 8950 |
| | 2 | 18.1 | 7 | 5.98 | 8760 |
| | 3 | 18.1 | 7 | 5.90 | 8820 |
| | 4 | 18.2 | 7 | 6.01 | 8695 |
| | 5 | 18.0 | 7 | 5.91 | 8525 |
| | | | (average | 5.95 | 8750) |
| Comparative Example 1 | 1 | 24.4 | 7 | 4.98 | 2150 |
| | 2 | 24.6 | 7 | 4.99 | 4100 |
| | 3 | 24.2 | 7 | 5.01 | 3655 |
| | 4 | 24.5 | 7 | 5.02 | 1825 |
| | 5 | 24.2 | 7 | 5.00 | 5770 |
| | | | (average | 5.00 | 3500) |

TABLE 2

| | Element No. | Voltage (V) | Driving Pulse width (μsec) | f max (kHz) | p max (sheets) |
|---|---|---|---|---|---|
| Example 2 | 1 | 18.0 | 7 | 6.05 | 8850 |
| | 2 | 18.0 | 3 | 6.10 | 8765 |
| | 3 | 18.1 | 7 | 6.10 | 8970 |
| | 4 | 18.0 | 7 | 6.15 | 8540 |
| | 5 | 18.2 | 7 | 6.10 | 8620 |
| | | | (average | 6.10 | 8749) |
| Comparative Example 2 | 1 | 24.4 | 7 | 4.98 | 3150 |
| | 2 | 24.6 | 7 | 5.00 | 4100 |
| | 3 | 24.5 | 7 | 5.02 | 1755 |
| | 4 | 24.2 | 7 | 4.99 | 1930 |
| | 5 | 24.2 | 7 | 5.01 | 4565 |
| | | | (average | 5.00 | 3100) |

EXAMPLE 3

Figure 10:
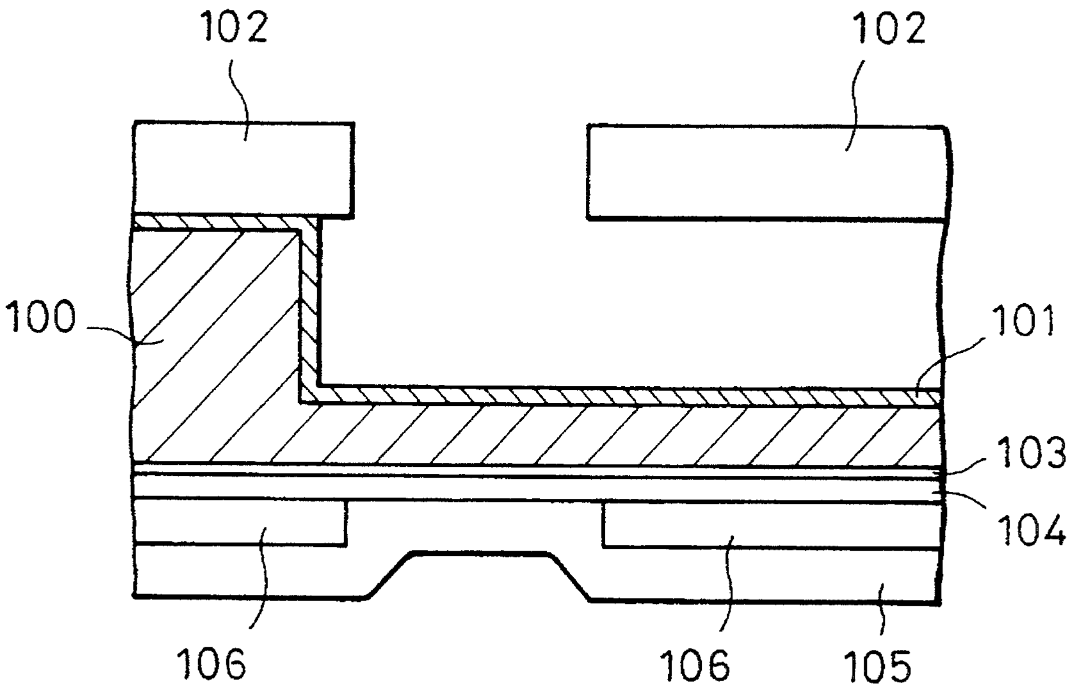
FIG. 10 is a perspective view which illustrates the schematic structure of an ink jet recording head according to another embodiment of the present invention.

In addition to the recording head according to examples 1 and 2 and arranged in such a manner that the direction in which the ink is discharged and the direction in which the ink is supplied to the heat acting surface are substantially the same, the present invention can be adapted to the recording head as shown in FIG. 10 and arranged in such a manner that the direction in which the ink is discharged and the direction in which the ink is supplied to the heat acting surface are substantially perpendicular to each other, resulting in a similar effect to be obtained.

The present invention enables an excellent effect to be obtained in the case where it is adapted to a recording head and a recording apparatus among a variety of ink jet recording methods of a type which records information by forming a flying fluid droplet by utilizing heat energy.

Its typical structure and principle have been disclosed in, for example, U.S. Pat. Nos. 4,723,129 and 4,740,796. It is preferable to embody the present invention by using the aforesaid basic principle. The aforesaid recording method can be adapted to both a so-called on-demand type apparatus and continuous type apparatus.

The aforesaid recording method will now be described briefly. One or more drive signals are applied to an electrothermal converter disposed to face a sheet or a fluid passage which holds fluid (ink) so as to, in accordance with information to be recorded, raise the temperature of the fluid (ink) to a level which exceeds the nucleate boiling point or which causes the nucleate boiling phenomenon to take place, so that heat energy is generated and film boiling is caused to take place in the heat acting surface of the recording surface. Since the bubble can be formed corresponding to the drive signal supplied to the electrothermal converter as described above, the aforesaid recording method can be effectively adapted to the on-demand type recording method. The enlargement and the contraction of the bubble cause the fluid (ink) to be discharged through the discharge port so that one or more droplets are formed. It is further preferable to employ a pulse drive signal in this case because the bubble can be adequately enlarged and contracted and therefore the fluid (ink) can responsively be discharged. It is preferable that the pulse drive signal be a signal of the type disclosed in U.S. Pat. Nos. 4,463,359 and 4,345,262. The adoption of the conditions for raising the temperature of the heat acting surface as disclosed in U.S. Pat. No. 4,313,124 will enable further satisfactorily recording to be performed.

As for the structure of the recording head, the present invention includes the aforesaid structure disclosed in each of the U.S. patents in which the discharge port, the fluid passage and the electrothermal converter are combined with one another (the straight fluid passage or the perpendicular fluid passage), and a structure disclosed in U.S. Pat. Nos. 4,558,333 and 4,459,600 in which the heat acting portion is disposed in a bent portion.

The present invention can be effectively adapted to a structure disclosed in Japanese Patent Laid-Open No. 59-123670 in which a common slit is used as the discharge port of a plurality of electrothermal converters and to a structure disclosed in Japanese Patent Laid-Open No. 59-138461 in which an opening for absorbing pressure waves of heat energy is disposed to face the discharge portion.

Furthermore, the present invention can be effectively adapted to a recording head of a full line type having the same length as the maximum width of the recording medium which can be recorded by the recording apparatus. The full line head may be a type disclosed in the aforesaid specifications and constituted by combining a plurality of recording heads or a type which has an integrally formed recording head.

The present invention can also effectively be adapted to a recording head of an interchangeable chip type which can be electrically connected to the body of the apparatus and to which ink can be supplied from the body of the apparatus, or to a recording head of a cartridge type which is integrally formed with the recording head.

It is preferable that recording head restoring means and/or an auxiliary means be added to the recording apparatus according to the present invention because the recording apparatus according to the present invention can be further stabilized. Specifically, it is preferable to add recording head capping means, cleaning means, pressurizing means or suction means, an electrothermal converter or another heating device or a preliminary heating means constituted by a combination thereof and means for performing preliminary discharging mode which performs an preliminary discharging in a addition to separate the recording operation.

The present invention can effectively be adapted to an apparatus having a mode in which an image of a main color such as black is recorded and a mode in which an image of a plurality of combined colors is recorded and/or a mode in which a full color image is recorded by mixing colors by arranging the structure in such a manner that an integrated recording head is employed or that a plurality of recording heads are combined.

Although the aforesaid embodiments of the present invention use liquid ink, ink in a solid state at the room temperature or ink which is .softened at the room temperature may be used. Since the aforesaid ink jet apparatus is arranged in such a manner that the temperature of the ink is controlled to be included by the range from 30° C. to 70° C. so as to make the viscosity of the ink to be included by a stable discharge range, the necessity lies in that the ink is formed into liquid at the time of applying the employed recording signal.

Ink of a type, which positively prevents an excessive rise of the temperature of the head and/or the ink due to heat energy by utilizing the heat energy as phase change energy from the solid state to the fluid state, may be used, or ink of a type may be used which is solidified in a state where the ink is allowed to stand for the purpose of preventing evaporation of the ink. The present invention may use ink of a type which is liquefied when heat energy is supplied, for example, ink may be used which is liquefied when heat energy is supplied in response to the recording signal so that fluid ink is discharged and ink, the solidification of which is commenced when it reaches the recording medium, may be used.

The most preferable method of the present invention is to adapt the aforesaid film boiling method to the employed ink.

The ink jet recording head and the recording apparatus according to the present invention will enable excellent effects to be obtained. For example, an image can be reliably recorded at high speed, a long life can be realized and excellent manufacturing yield can be realized.

Although the invention has been described in its preferred form with a certain degree of particularly, it is understood that the present disclosure of the preferred form may be changed in the details of construction and any combination and arrangement of parts may be resorted to without departing from the spirit and the scope of the invention as hereinafter claimed.

What is claimed is:

1. A method of manufacturing an ink jet recording head for recording an image by discharging ink to a recording medium through an ink discharge port, said method of manufacturing an ink jet recording head comprising the steps of:

forming a groove, which forms an ink passage communicating with said ink discharge port, by etching a given side of a substrate;

completing said ink passage by joining a cover member to the given side of said substrate; and providing an electrothermal transducer for generating thermal energy which is used for discharging the ink, at a portion corresponding to said groove, on an other side of said substrate.

2. A method according to claim 1, wherein said ink passage forming member is made of a material which is the same as the material of said substrate.

3. A method according to claim 1, wherein said ink passage forming member is made of a material which is different from the material of said substrate.

4. A method according to claim 1, wherein the surface of said substrate is made of an insulating material.

5. A method according to claim 1, wherein the surface of said substrate is made of an insulating material which contains Si.

6. A method according to claim 1, wherein said substrate is made of single crystal material.

7. A method according to claim 1, wherein said substrate is made of single crystal Si.

8. A method according to claim 1, wherein said heat acting surface has a structure constituted by stacking a plurality of layers.

9. A method according to claim 1, wherein said electrothermal converter has a heat resisting layer on at least one side surface thereof.

10. A method according to claim 1, wherein a direction in which the ink is discharged and a direction in which the ink is supplied to said heat acting surface are substantially the same.

11. A method according to claim 1, wherein a direction in which the ink is discharged and a direction in which the ink is supplied to said heat acting surface are substantially perpendicular to each other.

12. A method according to claim 1, wherein a plurality of said ink discharge ports are formed to correspond to the overall width of a recording region of the recording medium.

13. A method according to claim 1, wherein said ink jet recording head performs recording in such a manner that electricity is applied to said electrothermal converter in response to a recording signal, and a film boiling that takes place in the ink due to heat energy generated by said electrothermal converter is utilized, so that the ink is therefore discharged.

14. A method according to claim 1, wherein said ink jet recording head stores the ink for use in recording.

* * * * *

UNITED STATES PATENT AND TRADEMARK OFFICE
CERTIFICATE OF CORRECTION

PATENT NO. : 5,484,075

DATED : January 16, 1996

INVENTOR(S) : ISAO KIMURA ET AL.

It is certified that error appears in the above-identified patent and that said Letters Patent is hereby corrected as shown below:

COLUMN 1

Line 21, "cause" should read --causes--.

COLUMN 2

Line 10, "taken" should read --taking--.
Line 24, "formating" should read --formation--.
Line 45, "taken" should read --taking--.
Line 52, "ease" should read --the ease--.

COLUMN 3

Line 53, "cross sectional" should read --cross-sectional--.
Line 57, "cross sectional" should read --cross-sectional--.
Line 62, "cross sectional" should read --cross-sectional--.

CERTIFICATE OF CORRECTION

PATENT NO. : 5,484,075

DATED : January 16, 1996

INVENTOR(S) : ISAO KIMURA ET AL.

It is certified that error appears in the above-identified patent and that said Letters Patent is hereby corrected as shown below:

COLUMN 4

Line 1, "PREFERRED" should read --THE PREFERRED--.
Line 19, "Substrate" should read --Substrate)--.
Line 23, "cross sectional" should read --cross-sectional--.
Line 56, "cross sectional" should read --cross-sectional--.

COLUMN 5

Line 28, "resulting" should read --allowing--.

COLUMN 6

Line 16, "device 16" should read --device 126--.
Line 54, "cross sectional" should read --cross-sectional--.

COLUMN 7

Line 36, "insulting" should read --insulating--.
Line 40, "magnetton" should read --magnetron--.
Line 55, "Si02" should read --$SiO_2$--.
Line 57, "magnetton" should read --magnetron--.

UNITED STATES PATENT AND TRADEMARK OFFICE

CERTIFICATE OF CORRECTION

PATENT NO. : 5,484,075

DATED : January 16, 1996

INVENTOR(S) : ISAO KIMURA ET AL.

It is certified that error appears in the above-identified patent and that said Letters Patent is hereby corrected as shown below:

COLUMN 8

Line 36, "table 1" should read --Table 1--.
Line 38, "example 1" should read --Example 1--.
Line 53, "cross sectional" should read --cross-sectional--.
Line 60, "magnetton" should read --magnetron--.

COLUMN 9

Line 10, "Si02" should read --$SiO_2$--.
Line 13, "sputter" should read --sputtering--.
Line 21, "element" should read --element of--.
Line 52, "Example 2" should read --EXAMPLE 2--.
Line 56, "cross sectional" should read --cross-sectional--.

COLUMN 10

Line 33, "magnetton" should read --magnetron--.
Line 50, "magnetton" should read --magnetron--.
Line 57, "insulting" should read --insulating--.

UNITED STATES PATENT AND TRADEMARK OFFICE
CERTIFICATE OF CORRECTION

PATENT NO. : 5,484,075

DATED : January 16, 1996

INVENTOR(S) : ISAO KIMURA ET AL.

It is certified that error appears in the above-identified patent and that said Letters Patent is hereby corrected as shown below:

COLUMN 11

Line 55, "table 2" should read --Table 2--.
Line 56, "example 2" should read --Example 2--.
Line 64, "constitute" should read --constitutes--.

COLUMN 12

Line 5, "cross sectional" should read --cross-sectional--.
Line 30, "sputter" should read --sputtering--.
Line 63, "the a" should read --a--.

COLUMN 13

Line 40, "examples 1" should read --Examples 1--.

COLUMN 14

Line 58, "a" should be deleted and "the recording operation." should read --recording.--.

UNITED STATES PATENT AND TRADEMARK OFFICE

CERTIFICATE OF CORRECTION

PATENT NO. : 5,484,075

DATED : January 16, 1996

INVENTOR(S) : ISAO KIMURA ET AL.

It is certified that error appears in the above-identified patent and that said Letters Patent is hereby corrected as shown below:

COLUMN 15

Line 3, ".softened" should read --softened--.
Line 11, "type," should read --type--.

Signed and Sealed this

Twenty-eighth Day of May, 1996

Attest:

BRUCE LEHMAN

*Attesting Officer*

*Commissioner of Patents and Trademarks*